| (12) | United States Patent | (10) Patent No.: US 12,531,045 B2 |
|---|---|---|
| | Wang | (45) Date of Patent: Jan. 20, 2026 |

(54) AIR GUIDE AND NOISE REDUCTION DEVICE AND SERVER

(71) Applicant: SUZHOU METABRAIN INTELLIGENT TECHNOLOGY CO., LTD., Jiangsu (CN)

(72) Inventor: Yuxi Wang, Jiangsu (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 19/116,309

(22) PCT Filed: Apr. 23, 2024

(86) PCT No.: PCT/CN2024/089405
§ 371 (c)(1),
(2) Date: Mar. 27, 2025

(87) PCT Pub. No.: WO2025/007620
PCT Pub. Date: Jan. 9, 2025

(65) Prior Publication Data
US 2025/0259613 A1    Aug. 14, 2025

(30) Foreign Application Priority Data

Jul. 4, 2023    (CN) .......................... 202310811211.2

(51) Int. Cl.
*G10K 11/172*    (2006.01)
*G10K 11/16*    (2006.01)
*H05K 7/20*    (2006.01)

(52) U.S. Cl.
CPC .......... *G10K 11/172* (2013.01); *G10K 11/161* (2013.01); *H05K 7/20145* (2013.01); *H05K 7/20718* (2013.01)

(58) Field of Classification Search
CPC ............... G10K 11/161; G10K 11/172; H05K 7/20718; H05K 7/20145
See application file for complete search history.

(56) References Cited

U.S. PATENT DOCUMENTS 6,104,608 A * 8/2000 Casinelli ................. F24F 13/24
181/224
8,813,708 B2 * 8/2014 Miller ................ F02M 35/1216
123/184.21
(Continued)

FOREIGN PATENT DOCUMENTS

CN    113835500 A    12/2021
CN    216984786 U    7/2022
(Continued)

*Primary Examiner* — Forrest M Phillips
(74) *Attorney, Agent, or Firm* — IPro, PLLC (57) ABSTRACT

An air guide and noise reduction device and a server are provided. The air guide and noise reduction device includes: an air guide tunnel, the air guide tunnel has an air inlet and an air outlet, and an area of the air inlet is less than an area of the air outlet; and a resonant cavity, wherein the resonant cavity is communicated to the air guide tunnel through a plurality of first openings, so that the resonant cavity absorbs noise propagated along the air guide tunnel through the plurality of first openings and resonates with the noise. By using this device, sound waves propagated from a fan to a surface of a hard disk drive may be filtered out and eliminated, the impact of the sound waves on performance of the hard disk drive may be reduced.

20 Claims, 4 Drawing Sheets

(56) References Cited

U.S. PATENT DOCUMENTS

| | | | | |
|---|---|---|---|---|
| 9,607,598 | B2* | 3/2017 | Leon | B32B 3/12 |
| 9,625,077 | B2* | 4/2017 | Barbolini | F16L 55/033 |
| 10,041,697 | B1* | 8/2018 | Black | F24F 13/0227 |
| 10,309,305 | B2* | 6/2019 | Biset | F02C 7/045 |
| 10,540,953 | B2* | 1/2020 | Ishida | G10K 11/172 |
| 2009/0011696 | A1* | 1/2009 | Matthews | G10K 11/172 |
| | | | | 52/36.5 |
| 2010/0078258 | A1* | 4/2010 | Tanabe | G10K 11/172 |
| | | | | 181/224 |

FOREIGN PATENT DOCUMENTS

| | | |
|---|---|---|
| CN | 218467736 U | 2/2023 |
| CN | 116524890 A | 8/2023 |

* cited by examiner

AIR GUIDE AND NOISE REDUCTION DEVICE AND SERVER

CROSS-REFERENCE TO RELATED APPLICATION

This application claims the priority of the Chinese Patent application filed on Jul. 4, 2023 before the China National Intellectual Property Administration with the application number of 202310811211.2, and the title of "AIR GUIDE AND NOISE REDUCTION DEVICE AND SERVER", which is incorporated herein in its entirety by reference.

FIELD

The present application relates to the technical field of heat dissipation of servers and, more particularly, to an air guide and noise reduction device and a server.

BACKGROUND

With the technological evolution of high-capacity mechanical hard disk drives, their storage densities are increasingly large, and a track width has already counted in nanometers. When a magnetic head performs track seeking and track positioning work, the magnetic head needs to be accurately positioned above a designated track, which means that displacement of an entire HSA (hard disk drive head cantilever assembly, including a plurality of precision components such as a voice coil motor (VCM), a magnetic arm, and a magnetic head) system needs to be controlled within a few nanometers. A high-performance fan in a server produces very strong high-frequency random noise. The noise of the fan is propagated through the air to a surface of a hard disk drive, causing acoustic vibration coupling inside the hard disk drive and further causing resonance of the HSA system, track seeking and track positioning of the magnetic head are interfered with and a read and write speed of the magnetic head is decreased.

SUMMARY

In view of this, some embodiments of the present application aim to provide an air guide and noise reduction device and a server. By using the technical solutions of the present application, sound waves propagated from a fan to a surface of a hard disk drive may be filtered out and eliminated, impact of the sound waves on performance of the hard disk drive may be reduced, the performance of the hard disk drive is improved, and a damage rate of the hard disk drive is reduced, and an efficient and stable noise reduction solution for the server may be provided.

Based on the above objectives, an air guide and noise reduction device is provided by one aspect of some embodiments of the present application and the air guide and noise reduction device includes:

an air guide tunnel, wherein the air guide tunnel has an air inlet and an air outlet, and an area of the air inlet is less than an area of the air outlet; and a resonant cavity, wherein the resonant cavity is communicated to the air guide tunnel through a plurality of first openings, so that the resonant cavity absorbs noise propagated along the air guide tunnel through the plurality of first openings and resonates with the noise propagated along the air guide tunnel and resonates with the noise.

According to some embodiments of the present application, the resonant cavity includes a first resonant cavity arranged at an upper part of the air guide tunnel, and a second resonant cavity arranged at a lower part of the air guide tunnel.

According to some embodiments of the present application, the first resonant cavity includes a first curved surface portion; the second resonant cavity includes a second curved surface portion; and the first curved surface portion is opposite to the second curved surface portion to form the air guide tunnel.

According to some embodiments of the present application, a cross-sectional curve of the first curved surface portion and a cross-sectional curve of the second curved surface portion conform to a third-order or higher-order spline curve.

According to some embodiments of the present application, at the air inlet of the air guide tunnel, the cross-sectional curve of the first curved surface portion and the cross-sectional curve of the second curved surface portion bend in a same direction.

According to some embodiments of the present application, at the air outlet of the air guide tunnel, the cross-sectional curve of the first curved surface portion and the cross-sectional curve of the second curved surface portion bend in opposite directions.

According to some embodiments of the present application, an included angle between an orientation of the air inlet of the air guide tunnel and an orientation of the air outlet of the air guide tunnel is less than or equal to 90 degrees.

According to some embodiments of the present application, the air guide and noise reduction device further includes a partition plate located in the first resonant cavity and/or the second resonant cavity, wherein the partition plate is configured to divide the first resonant cavity and/or the second resonant cavity into a plurality of sub cavities.

According to some embodiments of the present application, the air guide and noise reduction device further includes a plurality of U-shaped slots located in the first resonant cavity and/or the second resonant cavity, wherein each of the plurality of U-shaped slots is configured to fix the partition plate.

According to some embodiments of the present application, the plurality of U-shaped slots are arranged in a direction parallel to an air flow direction of the air guide tunnel.

According to some embodiments of the present application, the plurality of U-shaped slots are arranged in a direction perpendicular to an air flow direction of the air guide tunnel.

According to some embodiments of the present application, the plurality of U-shaped slots are arranged side by side at different spacings.

According to some embodiments of the present application, the plurality of U-shaped slots include a plurality of slot widths.

According to some embodiments of the present application, the partition plate includes a plurality of partition plates with a plurality of thicknesses adapted to the plurality of slot widths.

According to some embodiments of the present application, the resonant cavity further includes:

a detachable upper cover, wherein the detachable upper cover is opposite to a curved surface portion of the resonant cavity.

According to some embodiments of the present application, the first openings are long-strip-shaped, and lengths of the first openings and widths of the first openings are determined based on a volume of the resonant cavity to be communicated to the first openings, a thickness of a cavity wall and a noise frequency at which resonance occurs.

According to some embodiments of the present application, the first openings include a plurality of circular holes; and a size of the plurality of circular holes and a quantity of the plurality of circular holes are determined based on a volume of the resonant cavity to be communicated to the first openings, a thickness of a cavity wall and a noise frequency at which resonance occurs.

According to some embodiments of the present application, the air guide and noise reduction device further includes:
 a sealing member, wherein the sealing member is capable of sealing a part of the first openings to adjust a resonant frequency of the resonant cavity communicated to the first openings.

According to some embodiments of the present application, the air guide and noise reduction device further includes:
 a thickening component attached to the cavity wall of the resonant cavity and configured to adjust a wall thickness of the resonant cavity to adjust a resonant frequency of the resonant cavity.

According to some embodiments of the present application, the air guide and noise reduction device further includes:
 a filling member filling the resonant cavity and configured to: change the volume of the resonant cavity and change a resonant frequency of the resonant cavity.

According to some embodiments of the present application, an avoidance slot configured for avoiding an adjacent component is further disposed in an outer surface of the resonant cavity.

A server is further provided by another aspect of some embodiments of the present application, and the server includes:
 the air guide and noise reduction device according to any one of embodiments stated above;
 a cooling fan; and
 a hard disk drive group,
 wherein the air inlet of the air guide and noise reduction device is adjacent to the hard disk drive group, and the air outlet is adjacent to the cooling fan; and the cooling fan is configured to: absorb air through the air guide and noise reduction device to form an air flow and blow the air flow toward other heat components.

The present application has the following technical effects: according to the air guide and noise reduction device provided by some embodiments of the present application, by disposing that the air guide tunnel has the air inlet and the air outlet, the area of the air inlet is less than the area of the air outlet, and the resonant cavity arranged around the air guide tunnel, wherein the air guide tunnel is communicated to the resonant cavity through the first openings, so that the resonant cavity absorbs noise propagated along the air guide tunnel through the first openings and resonates with the noise, sound waves propagated from the fan to the surface of the hard disk drive may be filtered out and eliminated; impact of the sound waves on performance of the hard disk drive may be reduced; the performance of the hard disk drive may be improved; a damage rate of the hard disk drive may be reduced; and an efficient and stable noise reduction solution may be provided for the server.

BRIEF DESCRIPTION OF THE DRAWINGS

In order to describe the technical solutions in some embodiments of the present application or in the related art more clearly, the drawings required to be used to describe some embodiments or the related art are briefly introduced in the following. Apparently, the drawings in the following description show merely some embodiments of the present application, and a person skilled in the art may still obtain some other embodiments according to these drawings without paying any creative efforts.

DETAILED DESCRIPTION

In order to make the objectives, technical solutions, and advantages of the present application clearer, the following is a further detailed explanation of some embodiments of the present application in conjunction with some embodiments and the drawings.

It should be noted that in some embodiments of the present application, all expressions of "first" and "second" are used to distinguish two different entities or two different parameters with the same name. It may be seen that "first" and "second" are only for the convenience of expression and should not be understood as limiting some embodiments of the present application. Subsequent embodiments will not explain them one by one.

In order to avoid resonance of an HSA system caused by fan noise, an air guide and noise reduction device is provided by the present application. The air guide and noise reduction device is arranged between a fan and a hard disk drive, may be mounted next to the hard disk drive, and may be fixedly connected to a hard disk drive backplane, a hard disk drive bracket, a hard disk drive frame, or a server chassis main body, with an opening facing a sound source direction, to filter out and eliminate sound waves propagated to a surface of a hard disk drive through the resonance effect, thereby the resonance of the HSA system is avoided, and reliability of reading and writing of the hard disk drive may be effectively ensured. The technical solution of the present application will be described in more details below in conjunction with accompanying drawings.

Figure 1:
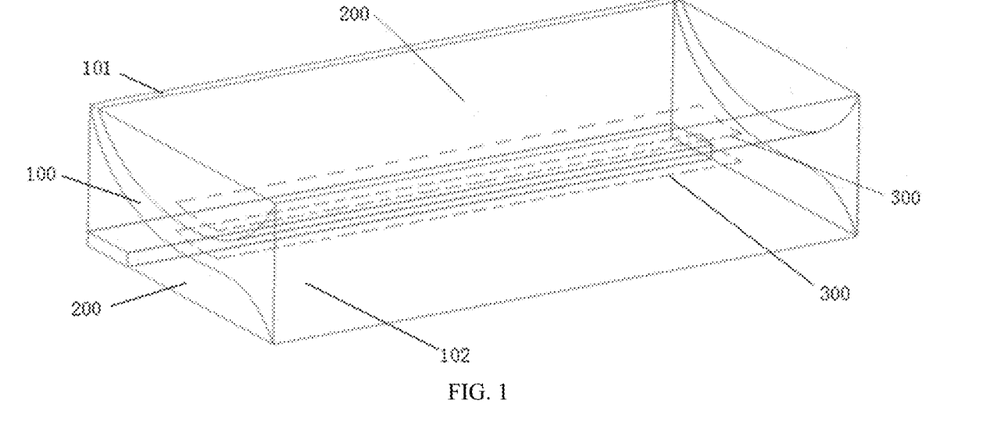
FIG. 1 is a schematic diagram of an air guide and noise reduction device according to some embodiments of the present application.

Referring to FIG. 1, a basic structure of the air guide and noise reduction device of the present application is shown. In some embodiments, the air guide and noise reduction device of the present application includes: an air guide tunnel 100 having an air inlet 101 and an air outlet 102, wherein an area of the air inlet 101 is less than an area of the air outlet 102; and a resonant cavity 200, wherein the resonant cavity 200 is arranged around the air guide tunnel 100. The air guide tunnel 100 is communicated to the resonant cavity 200 through first openings 300, so that the resonant cavity 200 absorbs noise propagated along the air guide tunnel 100 through the first openings 300 and resonates with the noise.

Figure 2:
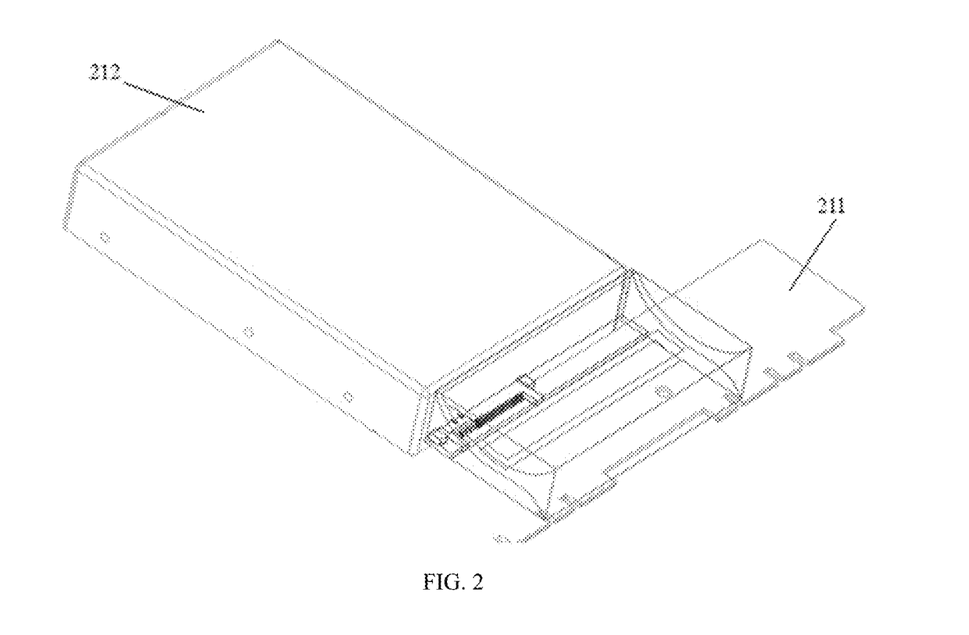
FIG. 2 is a schematic diagram of a hard disk drive backplane according to some embodiments of the present application.

A person skilled in the art should understand that the air guide and noise reduction device shown in some embodiments is a cuboid, which is a conventional shape and should not limit the possibility that the air guide and noise reduction device has other shapes in actual application scenarios. In addition, the cuboid shown in FIG. 1 is designed to be blocked at all positions except the preset air inlet 101, air outlet 102, and first openings 300. The air guide tunnels 100 shown at two sides of the cuboid are in a perspective form, and actually, the two sides are also blocked. That the area of the air inlet 101 of the air guide tunnel 100 is less than the area of the air outlet 102 has the effect: firstly, it is suitable for specific application scenarios. In practical applications, the air inlet 101 is arranged near a hard disk drive group, and the air outlet 102 is arranged near a fan of a server. The fan of the server extracts air from the air guide tunnel 100 to form air flow. Secondly, it helps to absorb noise. The noise is mainly generated by the fan of the server. In the process of propagating reversely along the air guide tunnel 100, the gradually narrowing air guide tunnel is more conducive for the noise to enter the corresponding resonant cavity 200 through the first openings 300 on the air guide tunnel 100 and resonate with the resonant cavity 200 (see FIG. 3 for the principle), thereby a frequency of the noise is changed and resonance between the noise and an HSA system of the hard disk drive group is avoided. In some embodiments, the air guide tunnel 100 is a smooth pipe with a gradually changing cross section. Openings at one side close to a hard disk drive are narrower and face upwards (toward an upper cover). Namely, the air inlet 101 has the narrower openings facing towards the upper cover. Openings at one side away from the hard disk drive are wider and face backwards (toward the fan). Namely, the air outlet 102 has the wider openings facing towards the fan. When the fan operates, the air is drawn into the pipe from a hard disk drive gap (which is a gap between upper and lower layers of hard disk drives or a gap between the hard disk drive and the upper cover), passes through the air guide tunnel 100, and flows out through the horn-shaped air outlet 102 into the fan. The noise generated by the fan enters the air guide tunnel 100 from the air outlet 102 and is propagated along the air guide tunnel 100 towards the air inlet 101. That is, a propagation direction of sound waves is opposite to an air flow direction. The horn-shaped structure of the air outlet 102 not only guides the air flow, but also has an effect of sound collection to collect the sound waves into the pipe. Openings and cavities are designed in upper and lower side walls of the pipe, so that the air inside the air guide tunnel 100 is communicated to the cavities to form the resonant cavity 200 and effectively eliminate the noise. The air guide and noise reduction device may adapt to various server models by modifying its appearance and assembling form, and has various mounting modes. In some embodiments, the air guide and noise reduction device may be used in a 1U server. The 1U server has a hard disk drive backplane 211 as shown in FIG. 2. A plane of the hard disk drive backplane 211 is parallel to a hard disk drive 212. An air flow direction in the 1U server is from the hard disk drive to the fan, namely, the way of air extraction. It is suitable for the design of a cross section of an air guide tunnel, an air inlet, and an air outlet in some embodiments. For different hard disk drive backplanes and air flow directions, the air guide tunnel and the appearance structure may be designed more flexibly. The appearance of the air guide and noise reduction device may also be transformed to adapt to any scenario with ventilation and noise reduction requirements, such as an air conditioner duct, an engine duct, and a data center cabinet. A person skilled in the art may flexibly set the appearance according to the concept of the present application.

Figure 3:
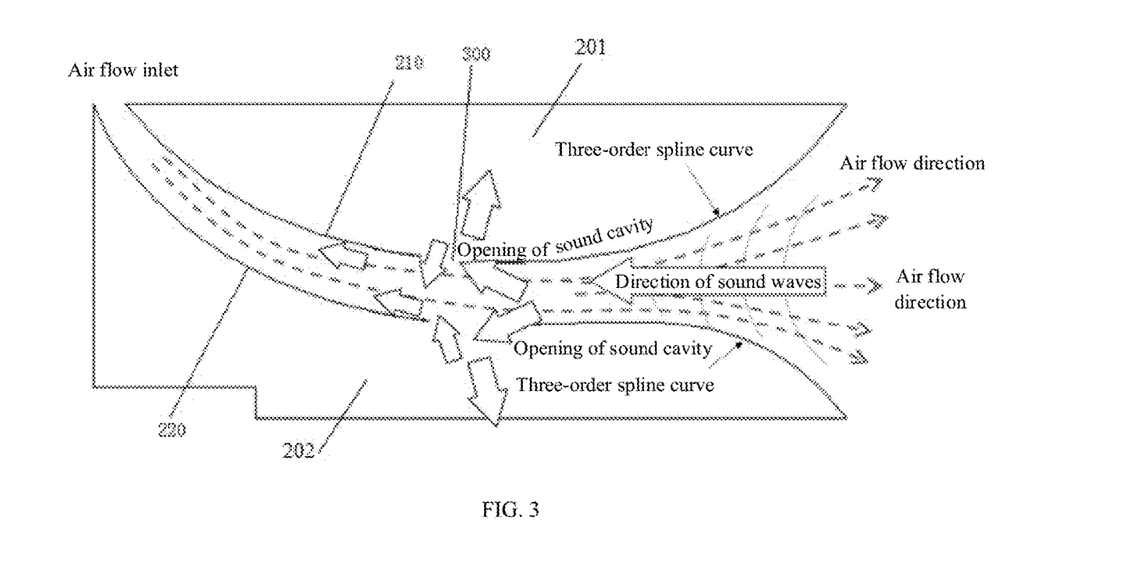
FIG. 3 is a schematic cross-sectional diagram of an air guide and noise reduction device according to some embodiments of the present application.

In some embodiments of the present application, in conjunction with FIG. 1 and FIG. 3, FIG. 3 shows a cross-sectional view of a basic structure of an air guide and noise reduction device of the present application. The resonant cavity 200 arranged around the air guide tunnel 100 includes: a first resonant cavity 201 arranged at an upper part of the air guide tunnel 100, and a second resonant cavity 202 arranged at a lower part of the air guide tunnel 100. The advantage of arranging a plurality of resonant cavities is that resonance with noise at a plurality of frequencies may be achieved, thereby the protection effect is enhanced. In addition, that the resonant cavities are arranged at the upper part and the lower part of the air guide tunnel may avoid noise leakage and achieve all-round isolation of the noise.

In some embodiments of the present application, continuing to refer to FIG. 3, the first resonant cavity 201 includes a first curved surface portion 210, and the second resonant cavity 202 includes a second curved surface portion 220. The first curved surface portion 210 is opposite to the second curved surface portion 220 to form the air guide tunnel 100. FIG. 3 shows some embodiments of arranging a resonant cavity 200 around the air guide tunnel 100. In some embodiments, the air guide tunnel 100 is completely surrounded by the opposite curved surfaces of the resonant cavities arranged at the upper and lower parts of the air guide tunnel. This design mode is conducive to absorbing noise and resonating with the noise. In some other embodiments, the resonant cavity and the air guide tunnel may be designed into two separate entities and are communicated through a branch pipe.

In some embodiments of the present application, continuing to refer to FIG. 3, a cross-sectional curve of the first curved surface portion 210 and a cross-sectional curve of the second curved surface portion 220 conform to a third-order or higher-order spline curve. In still some embodiments, at the air inlet 101 of the air guide tunnel 100, the cross-sectional curve of the first curved surface portion 210 and the cross-sectional curve of the second curved surface portion 220 bend in a same direction. At the air outlet 102 of the air guide tunnel 100, the cross-sectional curve of the first curved surface portion 210 and the cross-sectional curve of the second curved surface portion 220 bend in opposite directions. A bending form of the above higher-order spline curve and a bending form of the cross-sectional curves at the air inlet and the air outlet are disposed to have an effect of making a ventilation pipe have low air resistance.

In some embodiments of the present application, an included angle between an orientation of the air inlet 101 of the air guide tunnel 100 and an orientation of the air outlet 102 of the air guide tunnel 100 is less than or equal to 90 degrees. Limiting the orientation of the air inlet 101 and the orientation of the air outlet 102 may reduce air from the air outlet entering the air guide tunnel again through the air inlet, and reduce obstruction to flowing of the air in the air guide tunnel, thereby ensuring that the air flow is smooth and a flow velocity of the air meets a requirement.

Figure 7:
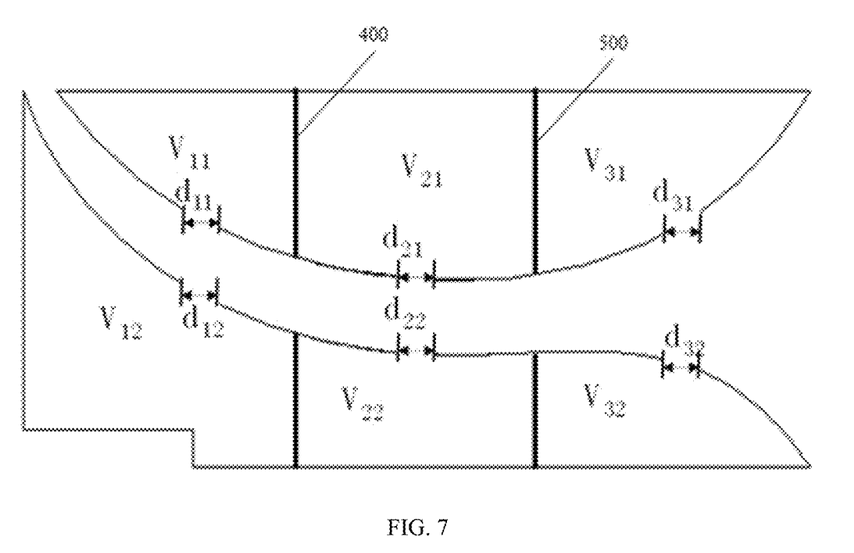
FIG. 7 is a schematic diagram of a plurality of resonant cavities according to some embodiments of the present application.

In some embodiments of the present application, referring to FIG. 7, the air guide and noise reduction device further includes: a partition plate 400. The partition plate 400 is configured to divide the corresponding resonant cavity 200 into a plurality of sub cavities. One or more partition plates 400 may be inserted into the first resonant cavity 201 and/or the second resonant cavity 202, respectively. A shape of each partition plate 400 needs to adapt to a shape of a resonant cavity at an insertion position. That is, after the partition plate 400 is inserted into the resonant cavity, the resonant cavity may be divided into two resonant cavities. That is, the first resonant cavity 201 and the second resonant cavity 202 may be divided into a plurality of sub resonant cavities. A quantity of sub resonant cavities corresponding to the first resonant cavity 201 and a quantity of sub resonant cavities corresponding to the second resonant cavity 202 may be the same or different. In some embodiments of the present application, the quantity of sub resonant cavities corresponding to the first resonant cavity 201 and the quantity of sub resonant cavities corresponding to the second resonant cavity 202 are set to be the same. Each sub resonant cavity has an independent first opening 300. Fan noise and other types of noise may enter the corresponding sub resonant cavities through these first openings 300 in the air guide tunnel and resonate with the resonant cavities, sound waves propagated from a fan to a surface of a hard disk drive may be filtered out and eliminate, impact of the sound waves on performance of the hard disk drive may be reduced, and the performance of the hard disk drive is improved. The plurality of sub resonant cavities are set to have different volumes. The sub resonant cavities with different volumes may eliminate sound waves at different frequencies. Fan noise and other types of noise are usually composed of noise at a plurality of frequencies. Therefore, different sub resonant cavities 200 may more effectively eliminate noise at different frequencies. In the example of FIG. 7, the entire resonant cavity is divided into six sub resonant cavities with corresponding volumes of V11, V12, V21, V22, V31, and V32. Widths of openings corresponding to the sub resonant cavities are d11, d12, d21, d22, d31, and d32.

In some embodiments, a plurality of independent sub resonant cavities may be designed. The sub resonant cavities have independent first openings 300 and different shapes, volumes, and curved surfaces. The sub resonant cavities may be combined to form a shape shown in FIG. 1. During use, the plurality of sub resonant cavities are combined into a specified shape and then mounted next to a hard disk drive, and may be fixedly connected to a hard disk drive backplane, a hard disk drive bracket, a hard disk drive frame, or a server chassis main body, with the openings facing a sound source direction, to filter out and eliminate sound waves propagated towards a surface of the hard disk drive through the resonance effect. When a sub resonant cavity is damaged, the sub resonant cavity may be replaced separately to reduce the costs of the air guide and noise reduction device, improve the efficiency of repair of the air guide and noise reduction device and improve the performance of the hard disk drive.

In some embodiments of the present application, as shown in FIG. 7, a plurality of U-shaped slots 500 are further included inside the first resonant cavity 201 and/or the second resonant cavity 202. The U-shaped slots 500 are configured to fix the partition plate 400. The slots 500 are respectively arranged in the first resonant cavity 201 and the second resonant cavity 202. Each slot 500 is generally U-shaped. A shape needs to be matched with a cross section of a resonant cavity at the slot position. This slot 500 is configured to insert a partition plate 400. That is, after one partition plate is inserted into the slot, the resonant cavity may be divided into two resonant cavities, and the two resonant cavities are sealed to each other. A quantity and positions of slots 500 in the first resonant cavity 201 and a quantity and positions of slots 500 in the second resonant cavity 202 may be the same or different. In some embodiments of the present application, the quantities and positions of the slots 500 in both the first resonant cavity 201 and the second resonant cavity 202 are set to be the same. After the partition plates 400 are inserted into the slots 500 in the first resonant cavity 201 and the second resonant cavity 202, the first resonant cavity 201 and the second resonant cavity 202 may be divided into a plurality of sub resonant cavities. Each sub resonant cavity needs to be provided with an independent first opening 300, namely, one sub resonant cavity is provided with one first opening 300. Fan noise and other types of noise may enter the corresponding sub resonant cavities through these first openings 300 in the air guide tunnel and resonate with the resonant cavities, sound waves propagated from a fan to a surface of a hard disk drive may be filtered out and eliminated, impact of the sound waves on performance of the hard disk drive is reduced, and the performance of the hard disk drive is improved. The plurality of sub resonant cavities are set to have different volumes. The sub resonant cavities with different volumes may eliminate sound waves at different frequencies. Fan noise and other types of noise are usually composed of noise at a plurality of frequencies. Therefore, different sub resonant cavities may more effectively eliminate noise at different frequencies.

In some embodiments of the present application, the plurality of U-shaped slots are arranged side by side in a direction perpendicular to the air flow direction of the air guide tunnel. The slots are respectively arranged in the first resonant cavity and the second resonant cavity. A shape of the slots needs to be matched with a cross section of a resonant cavity at the slot position. This slot is configured to insert a partition plate. That is, after one partition plate is inserted into the slot, the resonant cavity may be divided into two resonant cavities, and the two resonant cavities are sealed to each other. There may be a plurality of slots. The slots are spaced apart in a vertical direction. A quantity and positions of slots in the first resonant cavity and a quantity and positions of slots in the second resonant cavity may be the same or different. After the partition plates are inserted into the slots, the first resonant cavity and the second resonant cavity may be divided into a plurality of sub resonant cavities parallel to each other above and below. At a same time, each sub resonant cavity needs to be provided with an independent opening, namely, one sub resonant cavity is provided with one opening. Fan noise and other types of noise may enter the corresponding sub resonant cavities through these openings in the air guide tunnel and resonate with the resonant cavities, sound waves propagated from a fan to a surface of a hard disk drive may be filtered out and eliminated, impact of the sound waves on performance of the hard disk drive is reduced, and the performance of the hard disk drive is improved. The plurality of sub resonant cavities are set to have different volumes. The sub resonant cavities with different volumes may eliminate sound waves at different frequencies. Fan noise and other types of noise are usually composed of noise at a plurality of frequencies. Therefore, different sub resonant cavities may more effectively eliminate noise at different frequencies.

In some embodiments of the present application, the plurality of U-shaped slots are arranged side by side in a direction parallel to the air flow direction of the air guide tunnel. Similarly, the slots are respectively arranged in the first resonant cavity and the second resonant cavity. A shape of the slot needs to be matched with a cross section of a resonant cavity at the slot position. This slot is configured to insert the partition plate. That is, after one partition plate is inserted into the slot, the resonant cavity may be divided into two resonant cavities, and the two resonant cavities are sealed to each other. There may be a plurality of slots. The slots are spaced apart in a horizontal direction. A quantity and positions of slots in the first resonant cavity and a quantity and positions of slots in the second resonant cavity may be the same or different. After the partition plates are inserted into the slots, the first resonant cavity and the second resonant cavity may be divided into a plurality of sub resonant cavities parallel to each other on left and right. At a same time, each sub resonant cavity needs to be provided with an independent opening, namely, one sub resonant cavity is provided with one opening. Positions of the openings may be set according to a requirement. Fan noise and other types of noise may enter the corresponding sub resonant cavities through these openings in the air guide tunnel and resonate with the resonant cavities, sound waves propagated from a fan to a surface of a hard disk drive may be filtered out and eliminated, impact of the sound waves on performance of the hard disk drive may be reduced, and the performance of the hard disk drive is improved. The plurality of sub resonant cavities are set to have different volumes. The sub resonant cavities with different volumes may eliminate sound waves at different frequencies. Fan noise and other types of noise are usually composed of noise at a plurality of frequencies. Therefore, different sub resonant cavities may more effectively eliminate noise at different frequencies.

In some embodiments of the present application, the plurality of U-shaped slots are arranged side by side in different spacings. The slots in the first resonant cavity and the second resonant cavity may be spared apart at different spacings, and quantities of the slots may be different. In some embodiments, the slots in the first resonant cavity and the second resonant cavity may be spared apart at a same spacing, and quantities of the slots may also be the same. In some embodiments, the slots on the first resonant cavity and the second resonant cavity may be spared apart at different spacings, and quantities of the slots may be the same. In some embodiments, the slots in the first resonant cavity are spaced apart at a same spacing, and the slots in the second resonant cavity are spaced apart at a same spacing, but the spacing between the slots in the first resonant cavity is different from the spacing between the slots in the second resonant cavity. The quantity of the slots in the first resonant cavity and the quantity of the slots in the second resonant cavity are also different. Therefore, the spacings and quantities of the slots may be set according to requirements.

In some embodiments of the present application, the plurality of U-shaped slots include a plurality of slot widths to adapt to partition plates with different thicknesses. The widths of the slots may be set according to requirements. The slots are configured to insert the partition plates. After the partition plates are inserted into the slots, the resonant cavities may be divided into a plurality of sub resonant cavities. The plurality of sub resonant cavities have different volumes. The sub resonant cavities with different volumes may eliminate sound waves at different frequencies. Fan noise and other types of noise are usually composed of noise at a plurality of frequencies. Therefore, different sub resonant cavities may more effectively eliminate noise at different frequencies. Therefore, after the partition plates are inserted into the slots with different widths, the volumes of the corresponding sub resonant cavities may be changed to eliminate the noise at different frequencies.

In some embodiments of the present application, the partition plates have shapes that are adapted to the corresponding resonant cavities, and have various thicknesses to adapt to various slot widths.

In some embodiments of the present application, the resonant cavity further includes:

a detachable upper cover, wherein the detachable upper cover is opposite to a curved surface portion of the resonant cavity. That is, a detachable upper cover is arranged on a surface opposite to the curved surface of the first resonant cavity, and a detachable upper cover is arranged on a surface opposite to the curved surface of the second resonant cavity. When the partition plates need to be inserted into the resonant cavities, the detachable upper covers may be removed, and the corresponding partition plates are then mounted, so that the mounting of the partition plates may be completed without removing the entire air guide and noise reduction device. After the air guide and noise reduction device is used for a period of time, dust and foreign matters may enter the interior of the resonant cavities. After being accumulated to an extent, the dust may enter an air pipe through the openings and then enter an interior of the chassis, which may cause damage to the chassis. Therefore, the detachable upper covers may be removed regularly to clean the interior of the resonant cavities, thus a risk of damage to the chassis is lowered.

Figure 4:
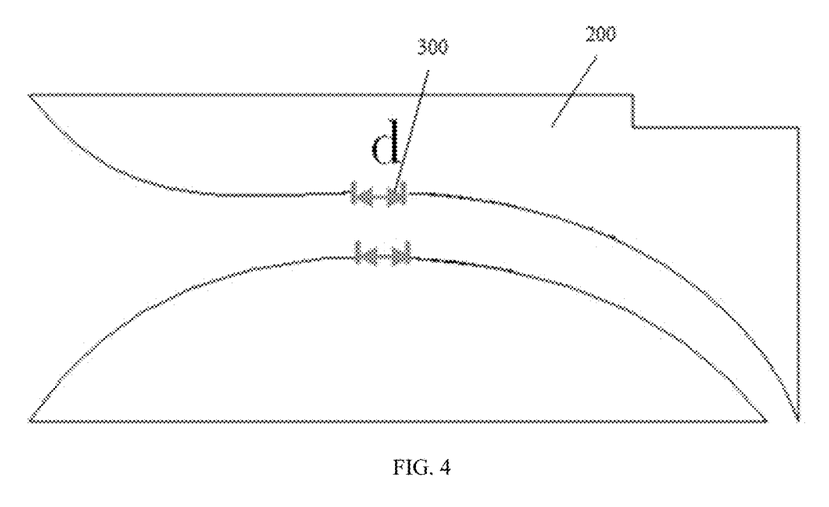
FIG. 4 is a schematic diagram of a width of an opening according to some embodiments of the present application.
Figure 5:
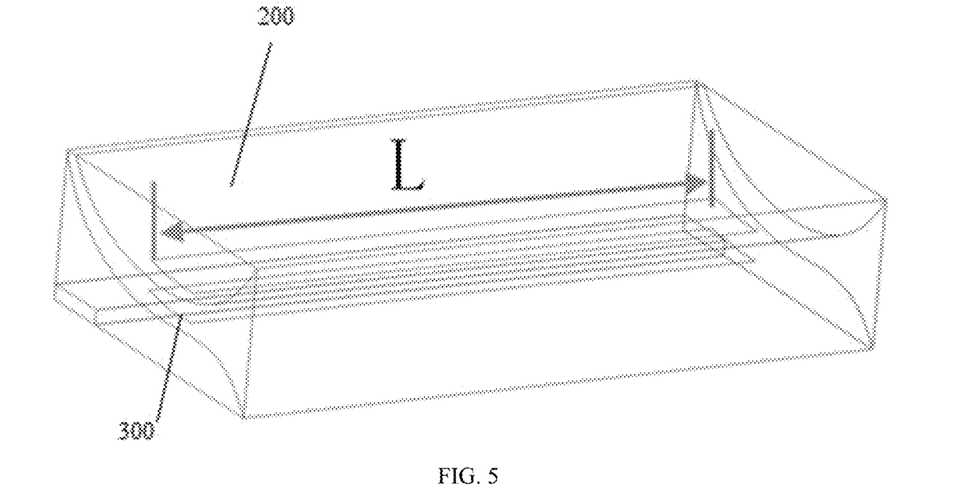
FIG. 5 is a schematic diagram of a length of an opening according to some embodiments of the present application.

In some embodiments of the present application, the first openings are long-strip-shaped, and lengths of the first openings and widths of the first openings are determined based on a volume of the resonant cavity to be communicated to the first openings, a thickness of a cavity wall, and a noise frequency at which resonance occurs. As shown in FIG. 4 and FIG. 5, a resonant frequency of the resonant cavity 200 is $$f = \frac{c}{2\pi}\sqrt{\frac{dL}{VT}},$$

wherein T represents a thickness of the resonant cavity 200; V represents a volume of the resonant cavity 200; f represents the resonant frequency; c represents a sound velocity in air, the sound velocity is related to temperature and density; d represents a width of each first opening 300; and L represents a length of the first opening 300. Therefore, values of the width of the opening and the length of the opening may be obtained based on a frequency of noise that will resonate, and the length of the opening and the width of the opening may be set according to a frequency of fan noise measured in advance and parameters of the resonant cavity 200.

Figure 6:
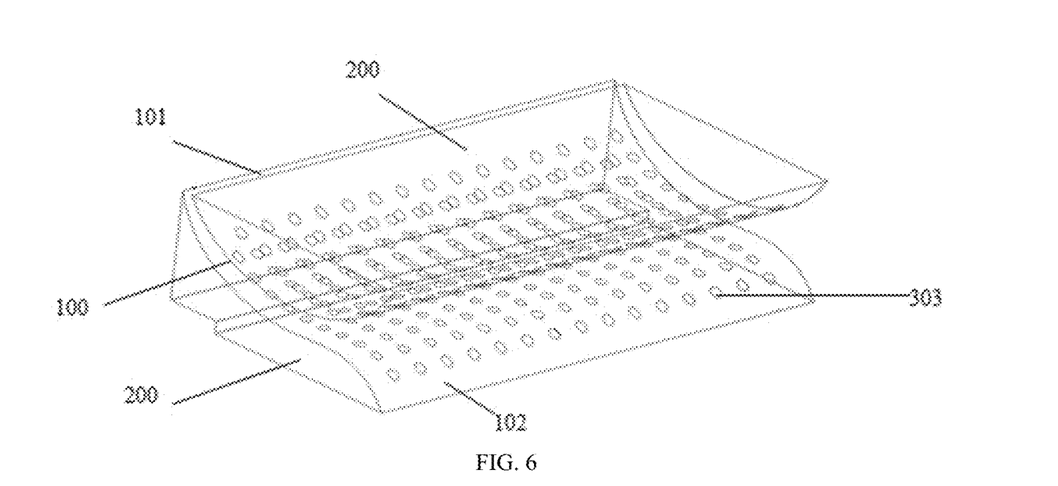
FIG. 6 is a schematic diagram of an opening being a circular hole according to some embodiments of the present application.

In some embodiments of the present application, as shown in FIG. 6, the first openings include a plurality of circular holes 303. A size of the plurality of circular holes 303 and a quantity of the plurality of circular holes 303 are determined based on a volume of the resonant cavity 200 to be communicated to the first openings, a thickness of a cavity wall, and a noise frequency at which resonance occurs. A resonant frequency of the resonant cavity 200 is $$f = \frac{c}{2\pi}\sqrt{\frac{S}{VT}},$$

wherein T represents a thickness of the resonant cavity 200; V represents a volume of the resonant cavity 200; f represents the resonant frequency; c represents a sound velocity in air, the sound velocity is related to temperature and density; and S represents a total area of the circular holes 303. Therefore, a value of the total area of the circular holes 303 may be obtained according to a frequency of noise that will resonant, and a quantity of the circular holes 303 and an area of each circular hole 303 may be set according to the value of the total area. The quantity of the circular holes 303 and the area of each circular hole may be set according to a frequency of fan noise measured in advance and parameters of the resonant cavity 200.

In some embodiments of the present application, the air guide and noise reduction device further includes:
  a sealing member, wherein the sealing member is capable of sealing a part of the first openings 300 to adjust a resonant frequency of the resonant cavity communicated to the first openings 300. A resonant frequency of the resonant cavity is $$f = \frac{c}{2\pi}\sqrt{\frac{dL}{VT}},$$

wherein T represents a thickness of the resonant cavity; V represents a volume of the resonant cavity; f represents the resonant frequency; c represents a sound velocity in air, the sound velocity is related to temperature and density; d represents a width of each opening; and L represents a length of the opening. Therefore, the width of the opening and the length of the opening may be adjusted according to the frequency of the noise to better eliminate the noise. The fan and other components in the chassis may need to be replaced. After the component is replaced, the frequency of the noise generated may change, and the original resonant cavity cannot well eliminate the noise. Therefore, the sealing member may be mounted at the first openings 300 to adjust the size of the openings, that is, the resonant frequency of the resonant cavity may be changed. A size of the sealing member may be set according to a frequency of new noise.

In some embodiments of the present application, the air guide and noise reduction device further includes:
  a thickening component attached to the cavity wall of the resonant cavity 200 and configured to adjust a wall thickness of the resonant cavity to adjust the resonant frequency of the resonant cavity. A resonant frequency of the resonant cavity is $$f = \frac{c}{2\pi}\sqrt{\frac{dL}{VT}},$$

wherein T represents a thickness of the resonant cavity; V represents a volume of the resonant cavity; f represents the resonant frequency; c represents a sound velocity in air, the sound velocity is related to temperature and density; d represents a width of each opening; and L represents a length of the opening. Therefore, the thickness of the resonant cavity may be adjusted according to the frequency of the noise to better eliminate the noise. The fan and other components in the chassis may need to be replaced. After the component is replaced, the frequency of the noise generated may change, and the original resonant cavity cannot well eliminate the noise. Therefore, the thickening component may be mounted inside the resonant cavity to adjust the thickness of the resonant cavity, that is, the resonant frequency of the resonant cavity may be changed. A thickness and size of the thickening component may be set according to a frequency of new noise.

In some embodiments of the present application, the air guide and noise reduction device further includes:
  a filling member filling the resonant cavity and configured to: fill the resonant cavity to change the volume of the resonant cavity and change a resonant frequency of the resonant cavity. A resonant frequency of the resonant cavity is $$f = \frac{c}{2\pi}\sqrt{\frac{dL}{VT}},$$

wherein T represents a thickness of the resonant cavity; V represents a volume of the resonant cavity; f represents the resonant frequency; c represents a sound velocity in air, the sound velocity is related to temperature and density; d represents a width of each opening; and L represents a length of the opening. Therefore, the volume of the resonant cavity may be adjusted according to the frequency of the noise to better eliminate the noise. The fan and other components in the chassis may need to be replaced. After the component is replaced, the frequency of the noise generated may change, and the original resonant cavity cannot well eliminate the noise. Therefore, a filler may be mounted inside the resonant cavity to adjust the volume of the resonant cavity, that is, the resonant frequency of the resonant cavity may be changed. A thickness and size of the filler may be set according to a frequency of new noise.

In some embodiments of the present application, an avoidance slot configured for avoiding an adjacent component is further disposed in an outer surface of the resonant cavity. The air guide and noise reduction device should be matched with a backplane around a hard disk drive, and a chassis structure, so that the avoidance slot configured for avoiding an obstacle may be designed on the outer surface of the resonant cavity, which may avoid interference with a connector on the backplane. For other electronic devices not shown in the figure, they are avoided in the same way. A quantity, size, and shape of the avoidance slot are not limited by the present application, which may be set according to an actual need.

By using the solution of the present application, sound waves propagated from a fan to a surface of a hard disk drive may be filtered out and eliminated, impact of the sound waves on performance of the hard disk drive may be reduced, the performance of the hard disk drive is improved, and a damage rate of the hard disk drive is reduced, and an efficient and stable noise reduction solution for the server may be provided.

Based on the above objective, a server is provided by a second aspect of some embodiments of the present application, and the server includes:
  the air guide and noise reduction device;
  a cooling fan; and
  a hard disk drive group, wherein the air inlet of the air guide and noise reduction device is adjacent to the hard disk drive group, and the air outlet is adjacent to the cooling fan; and the cooling fan is configured to: absorb air through the air guide and noise reduction device to form an air flow and blow the air flow toward other heat components.

As shown in FIG. 1, the air guide and noise reduction device includes: an air guide tunnel 100 having an air inlet 101 and an air outlet 102, wherein an area of the air inlet 101 is less than an area of the air outlet 102; and a resonant cavity 200, wherein the resonant cavity 200 is arranged around the air guide tunnel 100. The air guide tunnel 100 is communicated to the resonant cavity 200 through first openings 300, so that the resonant cavity 200 absorbs noise propagated along the air guide tunnel 100 through the first openings 300 and resonates with the noise.

Similarly, it should be understood that the air guide and noise reduction device shown in some embodiments is a cuboid, which is a conventional shape and should not limit the possibility that the air guide and noise reduction device has other shapes in actual application scenarios. In addition, the cuboid shown in FIG. 1 is designed to be blocked at all positions except the preset air inlet 101, air outlet 102, and first openings 300. The air guide tunnels 100 shown at two sides of the cuboid are in a perspective form, and actually, the two sides are also blocked. That the area of the air inlet 101 of the air guide tunnel 100 is less than the area of the air outlet 102 has the effect: firstly, it is suitable for specific application scenarios. In practical applications, the air inlet is arranged near a hard disk drive group, and the air outlet is arranged near a fan of a server. The fan of the server extracts air from the air guide tunnel to form air flow. Secondly, it helps to absorb noise. The noise is mainly generated by the fan of the server. In the process of propagating reversely along the air guide tunnel, the gradually narrowing air guide tunnel is more conducive for the noise to enter the corresponding resonant cavity through the first openings on the air guide tunnel and resonate with the resonant cavity (see FIG. 3 for the principle), thereby a frequency of the noise is changed and resonance between the noise and an HSA system of the hard disk drive group is avoided. In some embodiments, the air guide tunnel is a smooth pipe with a gradually changing cross section. Openings at one side close to a hard disk drive are narrower and face upwards (toward an upper cover). Namely, the air inlet has the narrower openings facing towards the upper cover. Openings at one side away from the hard disk drive are wider and face backwards (toward the fan). Namely, the air outlet has the wider openings facing towards the fan. When the fan operates, the air is drawn into the pipe from a hard disk drive gap (which is a gap between upper and lower layers of hard disk drives or a gap between the hard disk drive and the upper cover), passes through the air guide tunnel, and flows out through the horn-shaped air outlet into the fan. The noise generated by the fan enters the air guide tunnel from the air outlet and is propagated along the air guide tunnel towards the air inlet. That is, a propagation direction of sound waves is opposite to an air flow direction. The horn-shaped structure of the air outlet not only guides the air flow, but also has an effect of sound collection to collect the sound waves into the pipe. Openings and cavities are designed in upper and lower side walls of the pipe, so that the air inside the air guide tunnel is communicated to the cavities to form the resonant cavity 200 and effectively eliminate the noise. The air guide and noise reduction device may adapt to various server models by modifying its appearance and assembling form, and has various mounting modes.

Referring to FIG. 3, the resonant cavity 200 arranged around the air guide tunnel 100 includes: a first resonant cavity 201 arranged at an upper part of the air guide tunnel 100, and a second resonant cavity 202 arranged at a lower part of the air guide tunnel 100. The advantage of arranging a plurality of resonant cavities is that resonance with noise at a plurality of frequencies may be achieved, thereby the protection effect is enhanced. In addition, that the resonant cavities are arranged at the upper part and the lower part of the air guide tunnel may avoid noise leakage and achieve all-round isolation of the noise. In some embodiments of the present application, continuing to refer to FIG. 3, the first resonant cavity 201 includes a first curved surface portion 210, and the second resonant cavity 202 includes a second curved surface portion 220. The first curved surface portion 210 is opposite to the second curved surface portion 220 to form the air guide tunnel 100. FIG. 3 shows some embodiments of arranging a resonant cavity 200 around the air guide tunnel 100. In some embodiments, the air guide tunnel 100 is completely surrounded by the opposite curved surfaces of the resonant cavities arranged at the upper and lower parts of the air guide tunnel. This design mode is conducive to absorbing noise and resonating with the noise. In some other embodiments, the resonant cavity and the air guide tunnel may be designed into two separate entities and are communicated through a branch pipe.

In some embodiments of the present application, continuing to refer to FIG. 3, a cross-sectional curve of the first curved surface portion 210 and a cross-sectional curve of the second curved surface portion 220 conform to a third-order or higher-order spline curve. In still some embodiments, at the air inlet 101 of the air guide tunnel 100, the cross-sectional curve of the first curved surface portion 210 and the cross-sectional curve of the second curved surface portion 220 bend in a same direction. At the air outlet 102 of the air guide tunnel 100, the cross-sectional curve of the first curved surface portion 210 and the cross-sectional curve of the second curved surface portion 220 bend in opposite directions. A bending form of the above higher-order spline curve and a bending form of the cross-sectional curves at the air inlet and the air outlet are disposed to have an effect of making a ventilation pipe have low air resistance.

The server of the present application may filter out and eliminate sound waves propagated from the fan to a surface of the hard disk drive, that is, impact of the sound waves on performance of the hard disk drive is reduced, the performance of the hard disk drive is improved, and a damage rate of the hard disk drive is reduced, and an efficient and stable noise reduction solution for the server may be provided.

The above describes some exemplary embodiments disclosed in the present application, but it should be noted that various changes and modifications may be made without departing from the scope limited by the claims and disclosed in some embodiments of the present application. The functions, steps, and/or actions of the method claims of some disclosed embodiments described here do not need to be executed in any order. In addition, although the element disclosed in some embodiments of the present application may be described or claimed in an individual form, unless explicitly limited to a singular form. It may also be understood that there are a plurality of elements.

It should be understood that as used herein, unless the context clearly supports exceptions, the singular form "a/an" is intended to also include a plural form. It should also be understood that the term "and/or" used herein includes any and all possible combinations of one or more related listed items.

The sequential numbers of some embodiments of the present application described above are merely for description purpose but do not imply the preference of some embodiments.

Those of ordinary skill in the art should understand that the discussion of any of the above some embodiments is only illustrative and not intended to imply that the scope disclosed by some embodiments of the present application is limited to these examples. Under the ideas of some embodiments of the present application, the technical features of some embodiments or some other embodiments may also be combined, and there are many other changes in different aspects of some embodiments of the present application, which are not provided in the details for simplicity. Therefore, any omission, modification, equivalent replacement, and improvement made within the spirit and principle of some embodiments of the present application shall fall within the protection scope of some embodiments of the present application.

The invention claimed is:

1. An air guide and noise reduction device, comprising:
   an air guide tunnel, wherein the air guide tunnel is a pipe with a cross section of the air guide tunnel gradually changing, the air guide tunnel has an air inlet and an air outlet, and an area of the air inlet is less than an area of the air outlet; and
   a resonant cavity, wherein the resonant cavity is communicated to the air guide tunnel through a plurality of first openings, so that the resonant cavity absorbs noise propagated along an air flow of the air guide tunnel through the plurality of first openings and resonates with the noise propagated along the air flow of the air guide tunnel;
   wherein
      the resonant cavity comprises a first resonant cavity and a second resonant cavity; wherein
      the first resonant cavity comprises a first curved surface portion; the second resonant cavity comprises a second curved surface portion; and the first curved surface portion is opposite to the second curved surface portion to form the air guide tunnel;
      a first detachable upper cover, wherein the first detachable upper cover is opposite to a first curved surface portion;
      a second detachable upper cover, wherein the second detachable upper cover is opposite to a second curved surface portion;
   wherein an end of the first curved surface portion away from the air inlet contacts a surface of the first detachable upper cover; and an end of the second curved surface portion away from the air inlet contacts a surface of the second detachable upper cover.

2. The air guide and noise reduction device according to claim 1, wherein a cross-sectional curve of the first curved surface portion and a cross-sectional curve of the second curved surface portion conform to a third-order or higher-order spline curve.

3. The air guide and noise reduction device according to claim 2, wherein at the air inlet of the air guide tunnel, the cross-sectional curve of the first curved surface portion and the cross-sectional curve of the second curved surface portion bend in a same direction.

4. The air guide and noise reduction device according to claim 3, wherein at the air outlet of the air guide tunnel, the cross-sectional curve of the first curved surface portion and the cross-sectional curve of the second curved surface portion bend in opposite directions.

5. The air guide and noise reduction device according to claim 4, wherein an included angle between an orientation of the air inlet of the air guide tunnel and an orientation of the air outlet of the air guide tunnel is less than or equal to 90 degrees.

6. The air guide and noise reduction device according to claim 1, further comprising a partition plate located in the first resonant cavity and/or the second resonant cavity, wherein the partition plate is configured to divide the first resonant cavity and/or the second resonant cavity into a plurality of sub cavities.

7. The air guide and noise reduction device according to claim 6, further comprising a plurality of U-shaped slots located in the first resonant cavity and/or the second resonant cavity, wherein each of the plurality of U-shaped slots is configured to fix the partition plate.

8. The air guide and noise reduction device according to claim 7, wherein the plurality of U-shaped slots are arranged in a direction parallel to an air flow direction of the air guide tunnel.

9. The air guide and noise reduction device according to claim 7, wherein the plurality of U-shaped slots are arranged in a direction perpendicular to an air flow direction of the air guide tunnel.

10. The air guide and noise reduction device according to claim 7, wherein the plurality of U-shaped slots are arranged side by side at different spacings.

11. The air guide and noise reduction device according to claim 9, wherein the plurality of U-shaped slots comprise a plurality of slot widths.

12. The air guide and noise reduction device according to claim 11, wherein the partition plate comprises a plurality of partition plates with a plurality of thicknesses adapted to the plurality of slot widths.

13. The air guide and noise reduction device according to claim 1, wherein the first openings are long-strip-shaped, and lengths of the first openings and widths of the first openings are determined based on a volume of the resonant cavity to be communicated to the first openings, a thickness of a cavity wall and a noise frequency at which resonance occurs.

14. The air guide and noise reduction device according to claim 1, wherein the first openings comprise a plurality of circular holes; and a size of the plurality of circular holes and a quantity of the plurality of circular holes are determined based on a volume of the resonant cavity to be communicated to the first openings, a thickness of a cavity wall and a noise frequency at which resonance occurs.

15. The air guide and noise reduction device according to claim 13, further comprising:
   a sealing member, wherein the sealing member is capable of sealing a part of the first openings to adjust a resonant frequency of the resonant cavity communicated to the first openings.

16. The air guide and noise reduction device according to claim 13, further comprising:
   a thickening component attached to the cavity wall of the resonant cavity and configured to adjust a wall thickness of the resonant cavity to adjust a resonant frequency of the resonant cavity.

17. The air guide and noise reduction device according to claim 13, further comprising:
   a filling member filling the resonant cavity and configured to: change the volume of the resonant cavity and change a resonant frequency of the resonant cavity.

18. The air guide and noise reduction device according to claim 1, wherein an avoidance slot configured for avoiding an adjacent component is further disposed in an outer surface of the resonant cavity.

19. A server, comprising:
   the air guide and noise reduction device according to claim 1;
   a cooling fan; and
   a hard disk drive group,
   wherein the air inlet of the air guide and noise reduction device is adjacent to the hard disk drive group, and the air outlet is adjacent to the cooling fan; and the cooling fan is configured to: absorb air through the air guide and noise reduction device to form the air flow and blow the air flow toward other heat components.

20. The air guide and noise reduction device according to claim 14, wherein a resonant frequency of the resonant cavity is calculated by using a formula of $$f = \frac{c}{2\pi}\sqrt{\frac{S}{VT}},$$

wherein T represents the thickness of the cavity wall; V represents the volume of the resonant cavity; f represents the resonant frequency; c represents a sound velocity in air; and S represents a total area of the circular holes.

* * * * *